United States Patent
Li et al.

(10) Patent No.: US 7,486,551 B1
(45) Date of Patent: Feb. 3, 2009

(54) METHOD AND SYSTEM FOR PROVIDING DOMAIN WALL ASSISTED SWITCHING OF MAGNETIC ELEMENTS AND MAGNETIC MEMORIES USING SUCH MAGNETIC ELEMENTS

(75) Inventors: Zhanjie Li, Santa Clara, CA (US); Shengyuan Wang, Fremont, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 11/695,614

(22) Filed: Apr. 3, 2007

(51) Int. Cl.
*G11C 11/15* (2006.01)
(52) U.S. Cl. .................. 365/173; 365/158; 365/171
(58) Field of Classification Search .............. 365/158, 365/171, 173
See application file for complete search history.

(56) References Cited

U.S. PATENT DOCUMENTS

| | | | | |
|---|---|---|---|---|
| 6,728,132 | B2* | 4/2004 | Deak | 365/173 |
| 7,095,646 | B2* | 8/2006 | Slaughter et al. | 365/158 |
| 7,276,384 | B2* | 10/2007 | Parkin et al. | 738/3 |
| 2004/0012994 | A1* | 1/2004 | Slaughter et al. | 365/158 |
| 2007/0019337 | A1* | 1/2007 | Apalkov et al. | 360/324.1 |
| 2008/0013218 | A1* | 1/2008 | Fuke et al. | 360/313 |

OTHER PUBLICATIONS

J.C. Slonczewski, "Current-driven excitation of magnetic multilayers", Journal of Magnetism and Magnetic Materials 159 (1996) L1-L7.
L. Berger, "Emission of spin waves by a magnetic multilayer traversed by a current", Physical Review B, vol. 43, No. 13, Oct. 1, 1996, pp. 9353-9358.
D.C. Worledge, "Magnetic phase diagram of two identical coupled nanomagnets", Applied Physics Letters, vol. 84, No. 15, Apr. 12, 2004, pp. 2847-2849.
H. Fujiwara, et al., "Magnetization Behavior of Synthetic Antiferromagnet and Toggle-Magnetoresistance Random Access Memory", Trans. Magn. Soc. Japan, vol. 4, No. 4-1, 2004, pp. 121-129.
H. Fujiwara, et al., Critical-field curves for switching toggle mode magnetoresistance random access memory devices (invited), Journal of Applied Physics 97, 10P507-1, 2005.

* cited by examiner

*Primary Examiner*—Gene N. Auduong
(74) *Attorney, Agent, or Firm*—Strategic Patent Group, P.C.

(57) ABSTRACT

A method and system for providing a magnetic element is described. The magnetic element includes a pinned layer, a spacer layer, and a free layer. The spacer layer is nonferromagnetic and resides between the pinned layer and the free layer. The free layer includes a first magnetic layer and at least one of a second magnetic layer and an intermediate layer. The intermediate layer would reside between the first and second magnetic layers. The free layer also includes at least one domain wall therein during switching. In addition, the magnetic element is configured to allow the free layer to be switched at least in part due to spin transfer when a write current is passed through the magnetic element.

31 Claims, 10 Drawing Sheets

METHOD AND SYSTEM FOR PROVIDING DOMAIN WALL ASSISTED SWITCHING OF MAGNETIC ELEMENTS AND MAGNETIC MEMORIES USING SUCH MAGNETIC ELEMENTS

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. Typically, a conventional magnetic element is used for storing data in such magnetic memories.

FIG. 1 depicts a conventional magnetic element 10, which may be a conventional magnetic tunneling junction (MTJ) or a conventional spin valve. The conventional magnetic element 10 may be used in a conventional magnetic memory. The conventional MTJ 10 typically resides on a substrate (not shown), uses seed layer(s) 11 and includes a conventional antiferromagnetic (AFM) layer 12, a conventional pinned layer 14, a conventional barrier layer 16, a conventional free layer 18, and a conventional capping layer 20. The conventional pinned layer 14 and the conventional free layer 18 are ferromagnetic. The ferromagnetic layers 14 and 18 typically include materials from the group of Ni, Co, and Fe and their alloys, such as CoFe, CoFeNi, which are low-moment ferromagnetic materials. For example materials such as FeCoB, FeCoTa, and FeCoBTa, with B from five through thirty atomic percent and Ta from five to twenty percent are used. Although depicted as simple (single) layers, the pinned layer 14 and free layer 18 may include multiple layers. For example, the pinned layer 14 and/or the free layer 18 may include two ferromagnetic layers antiferromagnetically coupled through a thin Ru layer via RKKY exchange interaction—forming a synthetic antiferromagnetic (SAF) layer. For example, a layer of CoFeB separated by a thin layer of Ru may be used for the conventional pinned layer 14 and/or the conventional free layer 18. The thin layer of Ru may, for example be between three and several tens Angstroms thick. The conventional free layer 18 is typically thinner than the conventional pinned layer 14, and has a changeable magnetization 19. The saturation magnetization of the conventional free layer 18 is typically adjusted between four hundred and one thousand four hundred emu/cm$^3$ by varying the composition of elements. The magnetization 15 of the conventional pinned layer 14 is fixed, or pinned, in a particular direction, typically by an exchange-bias interaction with the AFM layer 12. Further, other versions of the conventional magnetic element 10 might include an additional pinned layer (not shown) separated from the free layer 18 by an additional nonmagnetic barrier or conductive layer (not shown).

Binary coded information, "1" or "0", typically corresponds to the magnetization 19 of the free layer 18 and the magnetization 15 of the pinned layer 14 being parallel or anti-parallel, respectively. Thus, data are written by setting the magnetization direction(s) of the free layer(s) 18 in a specified cell. This is typically accomplished either by applying an external field, for example using a recording head (not shown) or using the spin transfer effect. To change the magnetization state of the free layer 18 using the spin transfer effect, a current is driven in a current-perpendicular to the plane (CPP) direction (i.e. the z direction in FIG. 1) through the conventional magnetic element 10 having a small enough size.

If a magnetic field is used to switch the magnetization state of the free layer 18, such a magnetic field is generated by current driven through conductive lines (not shown), such as a bit and digit lines (not shown). However, one of ordinary skill in the art will recognize that the currents required to write to the conventional magnetic element 10 do not scale down as the size of the magnetic memory cell using the conventional magnetic element 10 decreases. Because of this, a relatively high current may be needed to generate a magnetic field sufficient to switch the state of the conventional magnetic element 10. Consequently, power consumption of the MRAM using the conventional magnetic element 10 increases and the high more reliability issues may be encountered. Such a write scheme may thus be unsuitable for use at higher densities.

In contrast, the spin transfer effect is used to provide current based switching, the conventional magnetic element 10 may be written by driving a current through the conventional magnetic element 10. For spin transfer based switching to become important is switching the magnetization state of the conventional magnetic element 10, the lateral dimensions of the magnetic element 10 may be small, for example in the range of a few hundred nanometers or less, in order to facilitate current-based switching through the spin transfer effect.

In a conventional magnetic memory employing the conventional magnetic element 10 and utilizing spin transfer, the current required to switch the free layer 18 decreases as the magnetic memory density grows (which corresponds to a decrease in the lateral dimensions of the magnetic element 10). In particular, current may scale down in a manner comparable to the semiconductor or CMOS technology evolution. Consequently, the conventional magnetic element 10 has potential for use in higher density magnetic memories.

Although current density scales down with increasing densities for memories using the conventional magnetic element 10, one of ordinary skill in the art will recognize that there are still barriers to using the conventional magnetic element 10. In particular, a lower current is desired. The current density for spin-transfer switching to occur (switching current density) is in general greater than $10^7$ A/cm$^2$. For sub-micron lateral dimensions of magnetic cells, this high switching current density implies a high switching current (current at which spin transfer switching occurs) and thus a high bias current. For example, the bias current, $I_c$, may be greater than two mA for a conventional magnetic element having lateral dimensions on the order of ~0.1×0.2 µm$^2$).

This high bias current is undesirable for a number of reasons. A high bias current implies that the magnetic memory using the conventional magnetic element 10 has a higher power consumption during writing. Lower power consumption is generally desirable. In addition, each cell in a magnetic memory typically includes at least one conventional magnetic element 10 and at least one isolation transistor. The transistor size is proportional to the saturation current. In order to support a higher bias current, the isolation transistor would thus have larger dimensions. Larger dimensions of the isolation transistor would result in a larger memory cell size and a memory having lower density. Thus, a lower switching current corresponding to a lower bias current, a lower transistor size, and a higher density are desired. In addition, if a barrier layer is used for the layer 16 (making the conventional magnetic element 10 a conventional MTJ), a voltage across the layer 16 that is than dielectric breakdown voltage of the layer 16 is required to ensure that the conventional magnetic element 10 does not fail. Thus, a smaller current passing through magnetic element 10 cell for a given RA (resistance-area product) is desired. For the above reasons, a smaller switching current is desired for spin transfer based switching of the conventional magnetic element 10.

In order to determine the switching current density, modeling behind the spin transfer model may be used. According to a prevalent spin transfer model ("Current-driven Excitation of Magnetic Multilayers," *Journal of Magnetism and Magnetic Materials*, vol. 159, p. L1-L5 (1996).), the switching current density can be expressed for the films having in-plane dominant anisotropy as $$J_c \propto \alpha M_s t F(H_{eff} + 2\pi M_s)/g \qquad (1)$$

where $\alpha$ is the phenomenological Gilbert damping constant, $t_F$ and $M_s$ are the thickness and saturation magnetization of the free layer, respectively. The effective field $H_{eff}$ includes the in-plane uniaxial anisotropy field, the shape anisotropy field, the external magnetic field, and the dipolar and exchange coupling fields between the free layer 18 and the other multilayers in the magnetic element 10, g corresponds to an efficiency of spin transfer effect. In equation (1), the demagnetizing field $2\pi M_s$ term dominates because $2\pi M_s >> H_{eff}$ for a typical ferromagnetic material (such as Co, Fe, Ni and their alloys). To reduce magnetization $M_s$ of the free layer is an efficient way to reduce $J_c$, since $J_c$ is proportional to $M_s^2$. On the other hand, reducing the magnetization $M_s$ results in the decrease of shape anisotropy and magnetic energy barrier which leads to the thermally-activated loss of the stored information. Consequently, without more, a reduction of the magnetization is not desirable for reducing the switching current of the conventional magnetic element 10.

Consequently, although the conventional magnetic element 10 has a possibility of being used in higher density memories, a lower switching current density is desired. Accordingly, what is needed is a method and system that may improve performance of the current-based switching of the conventional magnetic element 10. The method and system address such a need.

BRIEF SUMMARY OF THE INVENTION

A method and system for providing a magnetic element are described. The magnetic element includes a pinned layer, a spacer layer, and a free layer. The spacer layer is nonferromagnetic and resides between the pinned layer and the free layer. The free layer includes a first magnetic layer and at least one of a second magnetic layer and an intermediate layer. The intermediate layer would reside between the first magnetic layer and the second magnetic layer. The free layer also includes at least one domain wall therein during switching. In addition, the magnetic element is configured to allow the free layer to be switched at least in part due to spin transfer when a write current is passed through the magnetic element According to the method and system disclosed herein, a magnetic element capable of being written using a lower write current may be achieved.

DETAILED DESCRIPTION OF THE INVENTION

Figure 1:
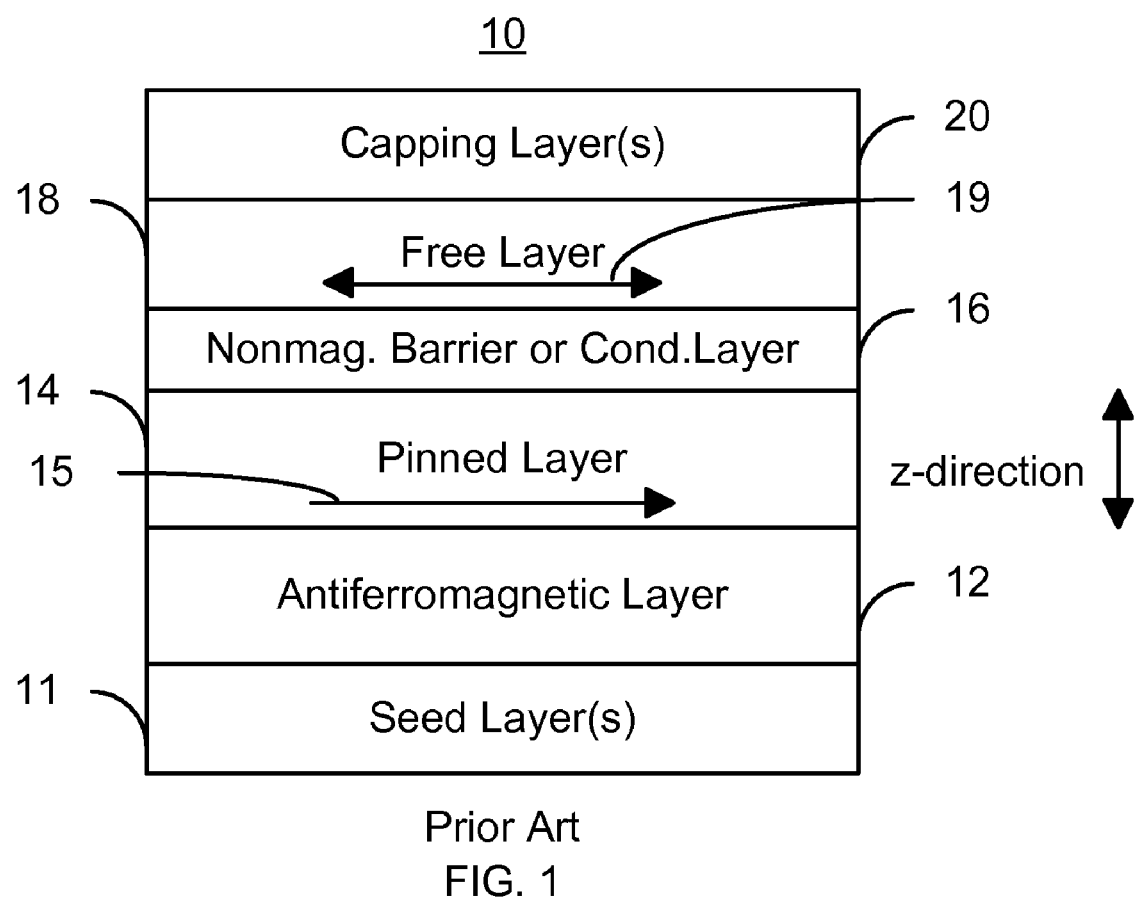
FIG. 1 is a diagram of a conventional magnetic element.

The method and system relate to magnetic memories. The following description is presented to enable one of ordinary skill in the art to make and use the method and system and is provided in the context of a patent application and its requirements. Various modifications to the embodiments and the generic principles and features described herein will be readily apparent to those skilled in the art. Thus, the method and system are not intended to be limited to the embodiments shown, but is to be accorded the widest scope consistent with the principles and features described herein.

A method and system for providing a magnetic element are disclosed. The magnetic element includes a pinned layer, a spacer layer, and a free layer. The spacer layer is nonferromagnetic and resides between the pinned layer and the free layer. The free layer includes a first magnetic layer and at least one of a second magnetic layer and an intermediate layer. The intermediate layer would reside between the first magnetic layer and the second magnetic layer. The free layer also includes at least one domain wall therein during switching. In addition, the magnetic element is configured to allow the free layer to be switched at least in part due to spin transfer when a write current is passed through the magnetic element.

The method and system are described in the context of particular magnetic elements and magnetic memories having certain components. One of ordinary skill in the art will readily recognize that the present invention is consistent with the use of magnetic elements and magnetic memories having other and/or additional components. The method and system will also be described in terms of a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements, bit lines, and word lines.

The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. For example, as depicted in the drawings, the bottoms of the structures are typically closer to an underlying substrate than the tops of the structures. However, one of ordinary skill in the art will readily recognize that the method and system are consistent with other structures having different relationships to the substrate. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used.

Figure 2:
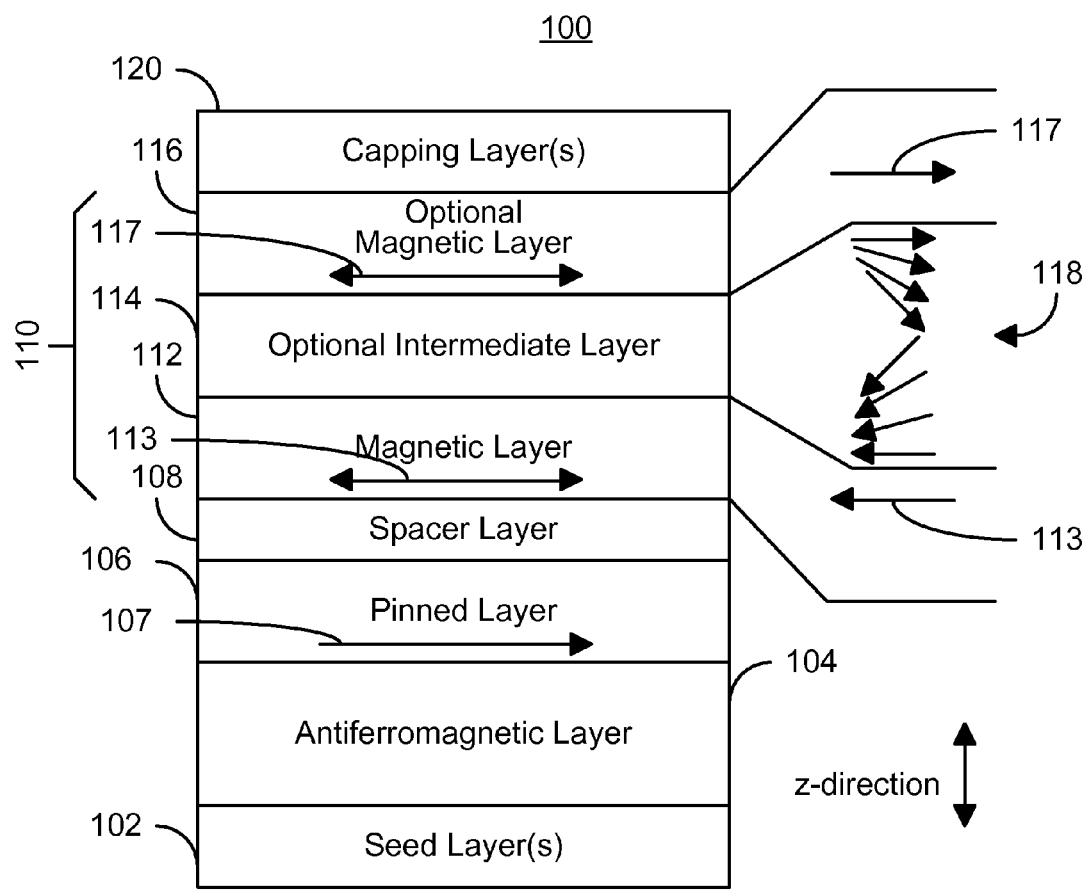
FIG. 2 is a diagram depicting an exemplary embodiment of a magnetic element including a close-up view of the domain wall in the free layer.

To more particularly describe the method and system, refer to FIG. 2, depicting an exemplary embodiment of a magnetic element 100 including a close-up view of the domain wall in the free layer during switching. The magnetic element 100 includes at least a pinned layer 106, a spacer layer 108, and a free layer 110. Also depicted are seed layer(s) 102, antiferromagnetic (AFM) layer 104, and capping layer(s) 120. The pinned layer 106 has a magnetization 107 that is preferably pinned, or substantially fixed, in place by the AFM layer 104. However, in another embodiment, the AFM layer 104 may be omitted and another mechanism used to pin the magnetization 107 of the pinned layer 106. The spacer layer 108 is nonmagnetic. In one embodiment, the spacer layer is conductive. In such an embodiment, the magnetic element 100 is similar to a spin valve. In another embodiment, the spacer layer 108 may be a barrier layer, for example an insulating tunneling barrier layer. In such an embodiment, the magnetic element 100 may be an MTJ.

The free layer 110 includes magnetic layer 112, optional magnetic layer 116, and optional intermediate layer 114. Note that the free layer 110 may omit the magnetic layer 116 or the intermediate layer 114, but not both. The free layer 110 also includes a domain wall 118 therein during switching. The magnetic layers 112 and 116 are magnetically coupled. For example, if the intermediate layer 114 is omitted, the magnetic layers 112 and 116 may be magnetostatically coupled. Alternatively, the magnetic layers 112 and 116 may be exchanged coupled. The magnetic layers 112 and 116 may also be ferromagnetically or antiferromagnetically coupled. The individual magnetic layers 112 and 116 may each be ferromagnetic or ferrimagnetic. The intermediate layer 114 may be nonmagnetic or magnetic (e.g. ferromagnetic or ferrimagnetic). The intermediate layer 114 may also be insulating, conductive, or a granular layer including an insulating matrix (not explicitly shown) with conductive grains (not explicitly shown), which may extend through the intermediate layer 114 to form channels.

The free layer 110 includes a domain wall 118 during switching. The domain wall 118 may reside in the intermediate layer 114, as shown in FIG. 2, if the intermediate layer 114 is provided. The domain wall 118 may be a Neel wall or Bloch wall, and preferably operates to assist spin transfer-based switching of the free layer 110. Although the intermediate layer 114 is shown, in another embodiment, any structure that can be used to provide the magnetic domain wall, such as Neel wall, Bloch wall, cross-tie wall and geometrically-constrained magnetic wall in the intermediate layer 114, or interfacial walls between the directly contacted/indirectly contacted magnetic layers 112 and 116 may be suitable for use n the magnetic element 100.

In operation, a bias current may be provided in the z-direction. Depending upon the information desired to be stored, the bias current may be from the capping layer(s) 120 to the seed layer(s) 102, or vice versa. The bias current is preferably small enough that, without the presence of the domain wall 118 during switching, the spin transfer induced would be insufficient to switch the magnetization of the free layer 110. The bias current increases from zero to a critical value. This critical value is such that the spin transfer torque is sufficient to switch one of the magnetizations 113 and 117 of the magnetic layers 112 and 116, respectively. As a result, the domain wall 118 is produced in the intermediate layer 114 or across the interface between two magnetic layers 112 and 116 if the intermediate layer 114 is omitted The other of the magnetic layers 116 and 112 respectively, may then switch due to the combination of the spin transfer torque and motion of the domain wall 118 through the tree layer 110. The combination of the spin torque produced by the spin-polarized current and the domain wall propagation through the intermediate layer 114 or interface is sufficient to switch the free layer 110 whereas the spin torque acting alone may not sufficient enough for reversal of both of the magnetic layers 112 and 116

The magnetization switching process by a propagation of domain wall follow a path of low energy. For an elliptical free layer, whose size $$\frac{\pi}{4} ab t_F,$$

the energy barrier for switching through a coherent rotation is $$E_R = \frac{1}{2} H_K M_s ab\pi t_F.$$

In contrast, the energy barrier for switching through a domain wall motion can be estimated as the energy to create a partial domain wall in the free layer, namely, $E_w = \frac{1}{8} H_K M_s ab\pi t_F$. We obtain a ratio $\lambda=E_w/E_R=0.25$. Thus the energy barrier for switching through the domain wall propagation, as compared to the barrier of uniform rotation is reduced by a factor of four. Consequently, through generation of the domain wall 118, the energy to switch the free layer 110, and thus the critical current for switching of the free layer 110, may be reduced. As a result, the magnetic element 100 may have reduced power consumption during writing and may be used with a smaller isolation transistor. Consequently, the magnetic element 100 may be more suitable for use in high density magnetic memories. The magnetic layers 112 and 116 may also be engineered to improve switching of the free layer 110. One of the magnetic layers 112 and 116 is preferably soft, has a low magnetization ($M_s$) and a very low crystalline anisotropy. For example, CoFeNiB or CoFeB may be used. The other of the magnetic layers 116 and 112 may be a harder layer having a higher magnetization and a higher crystalline anisotropy. For example, Co or CoFe may be used. In another embodiment, the magnetic layers 112 and 116 may be formed of similar materials. In such an embodiment, the layer 112 or 116 desired to be softer, have a lower magnetization and lower crystalline anisotropy may be made thinner. For example, in one embodiment, $CoFeB_{30}$ may be used for the magnetic layer 112 and/or 116. In such an embodiment, the magnetization of the layer 112 and/or 116 may be approximately four hundred through six hundred $emu/cm^3$ and the crystalline anisotropy approximately five through fifty Gauss.

When none of the magnetic layers 112 and 116 of the tree layer 110 has a lower magnetization $M_s$, a higher spin torque efficiency g or a smaller damping constant α, the switching current density may be further reduced while maintaining thermal stability. In such a magnetic element 100, the soft layer 112 or 116 may switch first, at a lower current. The other, hard layer 116 or 112 still be in a stable state. The domain wall 118 may be formed near the interface of the layers 112 and 116 or in the intermediate layer 114. As the bias current is increased to the critical current for the entire free layer 110, the domain wall 118 propagates through the free layer 110 and switches the hard layer 116 or 112. Moreover, the exchange coupling between the magnetic layers 112 and 116 may be optimized such that the critical current density, or switching current density, for the free layer 110 may be reduced. Thus, the free layer 110 may switch at a lower current density than a conventional free layer, such as the tree layer 18. In addition, the spin-flop field is the geometric mean of the intrinsic anisotropy and the hard-axis saturation field and is related the exchange coupling constant between the two magnetic layers 112 and 116. Because one layer 112 or 116 is harder, thermal stability of the magnetic element 100 may, therefore, be improved. Thus, use of the magnetic layers 112 and 116 may improve thermal stability of the magnetic element 100 while reducing the switching current density. Consequently, the benefits of the magnetic element 100 may be enhanced.

Figure 3:
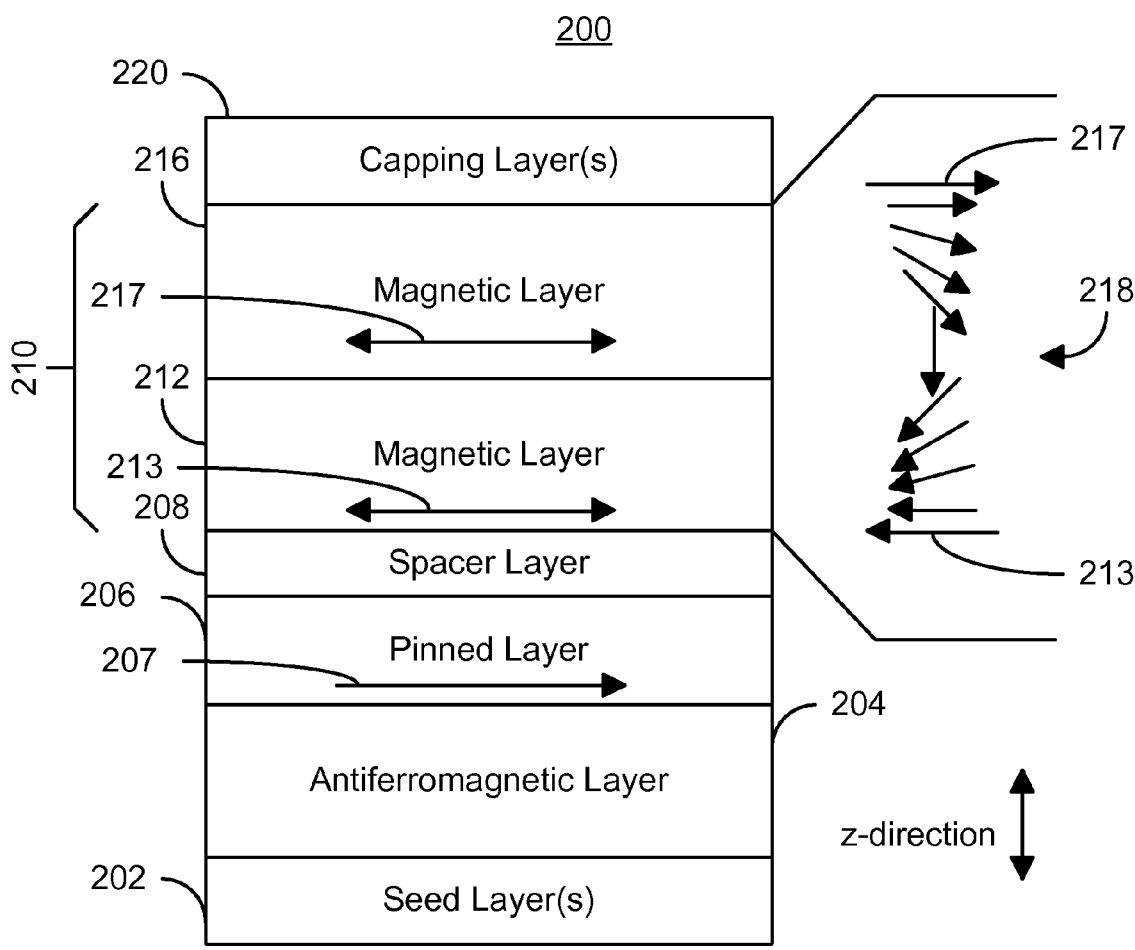
FIG. 3 is a diagram depicting another exemplary embodiment of a magnetic element including a close-up view of the domain wall in the free layer.

FIG. 3 is a diagram depicting another exemplary embodiment of a magnetic element 200 including a close-up view of the domain wall in the free layer during switching. The magnetic element 200 is analogous to the magnetic element 100. Consequently, analogous structures are labeled similarly. The magnetic element 200 thus includes at least a pinned layer 206, a spacer layer 208, and a free layer 210. Also depicted are seed layer(s) 202, AFM layer 204, and capping layer(s) 220. The pinned layer 206 has a magnetization 207 that is preferably pinned, or substantially fixed, in place by the AFM layer 204. However, in another embodiment, the AFM layer 204 may be omitted and another mechanism used to pin the magnetization 207 of the pinned layer 206. The spacer layer 208 is nonmagnetic. In one embodiment, the spacer layer 208 is conductive. In another embodiment, the spacer layer 208 may be a barrier layer, for example an insulating tunneling barrier layer.

The free layer 210 includes magnetic layers 212 and 216 that are adjacent and thus share an interface. Consequently, the optional intermediate layer 114 depicted in FIG. 2 has been omitted. Referring back to FIG. 3, the free layer 210 also includes a domain wall 218 therein during switching. The magnetic layers 212 and 216 are magnetically coupled. The magnetic layers 212 and 216 may also be ferromagnetically or antiferromagnetically coupled. The individual magnetic layers 212 and 216 may each be ferromagnetic or ferrimagnetic.

The free layer 210 also includes a domain wall 218 within the magnetic layers 212 and 216 during switching. The domain wall 218 may be a Neel wall or Bloch wall, and preferably operates to assist spin transfer-based switching of the free layer 210, as discussed above. In one embodiment, the domain wall 218 resides substantially in interfacial walls between the directly contacted/indirectly contacted magnetic layers 212 and 216.

The magnetic element 200 operates in a similar manner to the magnetic element 100, Consequently, the domain wall 218 formation assists in switching the free layer 210 and may result in a lower switching current density. Furthermore, in a preferred embodiment, one of the magnetic layers 212 and 216 is preferably soft, has a low magnetization ($M_s$) and a very low crystalline anisotropy. For example, CoFeNiB or CoFeB may be used. The other of the magnetic layers 216 and 212 may be a harder layer having a higher magnetization and a higher crystalline anisotropy. For example, Co, Fe or CoFe may be used. In another embodiment, similar magnetic materials may be used for the magnetic layers 212 and 216. In such an embodiment, the layer 212 or 216 desired to be softer, have a lower magnetization and lower crystalline anisotropy may be made thinner. Consequently, as discussed above, the magnetic element 200 may have lower switching current density with improved thermal stability, Consequently, the magnetic element 200 has similar benefits to the magnetic element 100.

Figure 4:
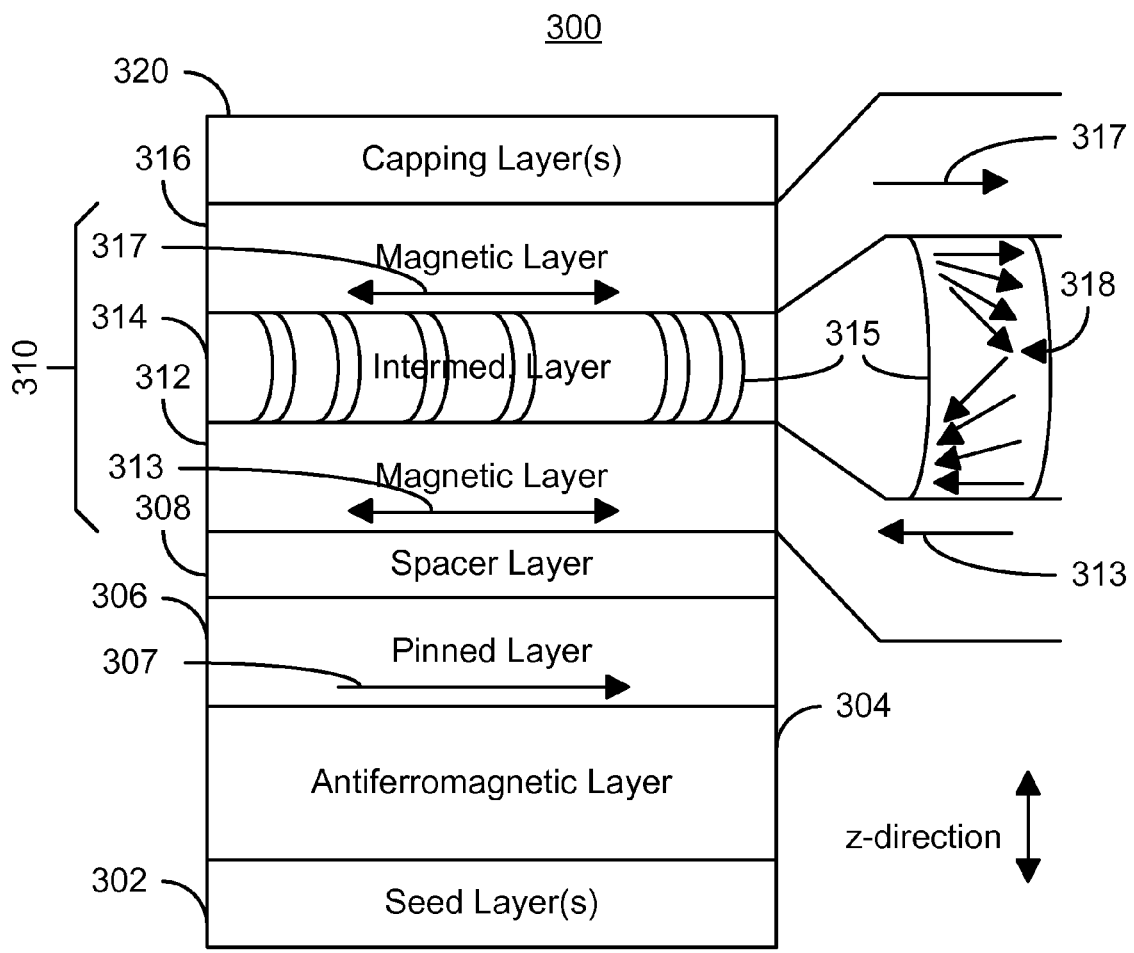
FIG. 4 is a diagram depicting another exemplary embodiment of a magnetic element including a close-up view of the domain wall in the free layer.

FIG. 4 is a diagram depicting another exemplary embodiment of a magnetic element 300 including a close-up view of the domain wall in the free layer during switching. The magnetic element 300 is analogous to the magnetic element 100. Consequently, analogous structures are labeled similarly. The magnetic element 300 thus includes at least a pinned layer 306, a spacer layer 308, and a free layer 310. Also depicted are seed layer(s) 302, AFM layer 304, capping layer(s) 320. The pinned layer 306 has a magnetization 307 that is preferably pinned, or substantially fixed, in place by the AFM layer 304. However, in another embodiment, the AFM layer 304 may be omitted and another mechanism used to pin the magnetization 307 of the pinned layer 306. The spacer layer 308 is nonmagnetic. In one embodiment, the spacer layer 308 is conductive. In another embodiment, the spacer layer 308 may be a barrier layer, for example an insulating tunneling barrier layer.

The free layer 310 includes magnetic layers 312 and 316 that are separated by intermediate layer 314. The intermediate layer 314 shown is a magnetic (e.g. ferromagnetic or ferrimagnetic) granular intermediate layer. Thus, the intermediate layer 314 includes grains, or channels 315, that are ferromagnetic or ferrimagnetic. The free layer 310 also includes a domain wall 318 therein during switching. The magnetic layers 312 and 316 are magnetically coupled. The magnetic layers 312 and 316 may also be ferromagnetically or antiferromagnetically coupled. The individual magnetic layers 312 and 316 may each be ferromagnetic or ferrimagnetic.

The free layer 310 also includes a domain wall 318, preferably within the intermediate layer 314 during switching. The domain wall 318 may be a Neel wall or Bloch wall, and preferably operates to assist spin transfer-based switching of the free layer 310, as discussed above. In one embodiment, the domain wall 318 forms in the ferromagnetic grains, or channels, 315 of the intermediate layer 314. The domain wall 318 preferably forms in each of the channels 315 of the intermediate layer 314. In operation, one of the magnetic layers 312 or 316 switches. The domain walls 318 may thus be formed throughout the intermediate layer 314 and aid in switching the remaining magnetic layer 316 or 312.

The magnetic element 300 operates in a similar manner to the magnetic element 100. Consequently, the domain wall 318 formation assists in switching the tree layer 310 and may result in a lower switching current density. Furthermore in one embodiment, one of the magnetic layers 312 and 316 is preferably soft, has a low magnetization ($M_s$) and a very low crystalline anisotropy. The other of the magnetic layers 316 and 312 may be a harder layer having a higher magnetization and a higher crystalline anisotropy. For example, the materials and relative thicknesses discussed above may be used. As a result, as discussed above, the magnetic element 300 may have lower switching current density with improved thermal stability. Consequently, the magnetic element 300 has similar benefits to the magnetic element 100.

Figure 5:
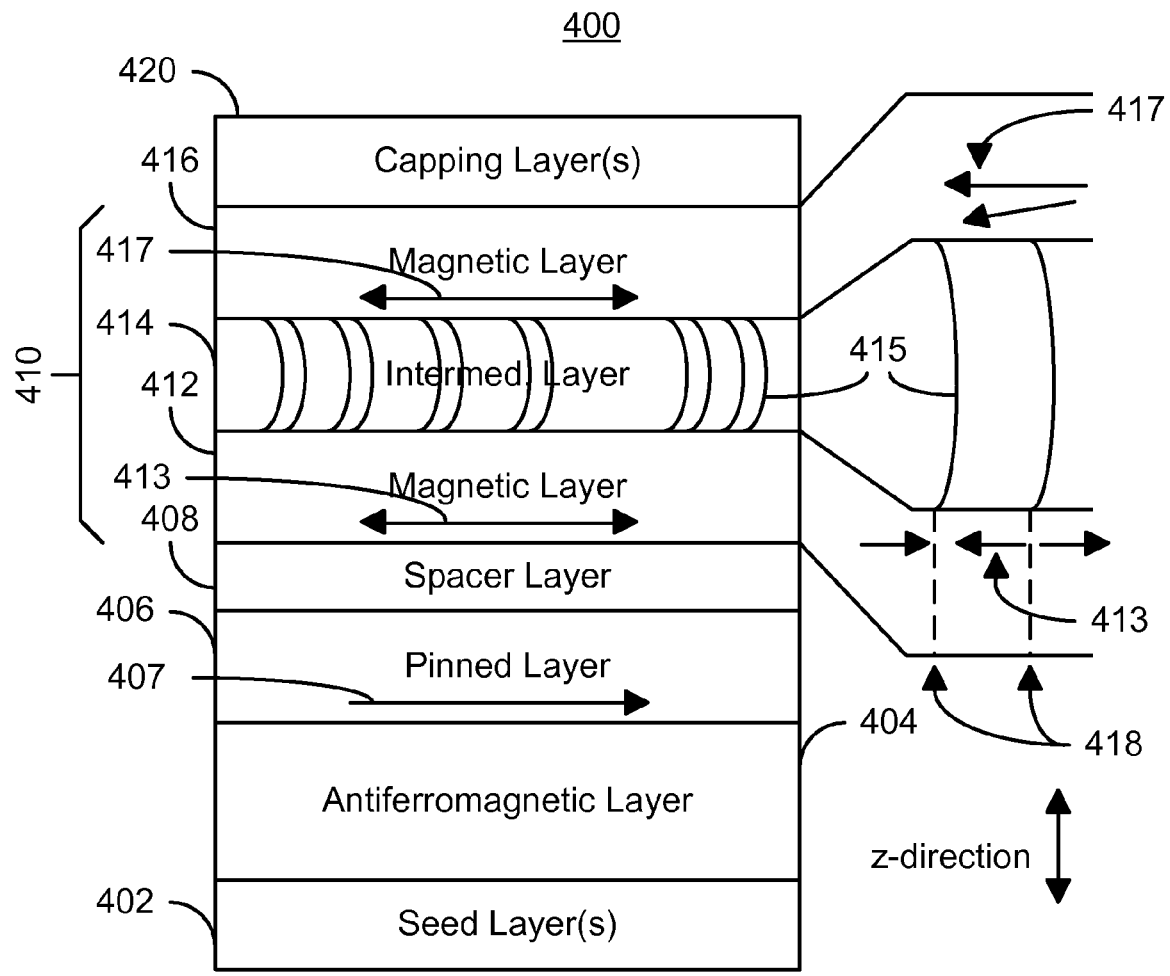
FIG. 5 is a diagram depicting another exemplary embodiment of a magnetic element including a close-up view of the domain wall in the free layer.

FIG. 5 is a diagram depicting another exemplary embodiment of a magnetic element 400 including a close-up view of the domain wall in the free layer during switching. The magnetic element 400 is analogous to the magnetic element 100. Consequently, analogous structures are labeled similarly. The magnetic element 400 thus includes at least a pinned layer 406, a spacer layer 408, and a free layer 410. Also depicted are seed layer(s) 402, AFM layer 404, and capping layer(s) 420. The pinned layer 406 has a magnetization 407 that is preferably pinned, or substantially fixed, in place by the AFM layer 404. However, in another embodiment, the AFM layer 404 may be omitted and another mechanism used to pin the magnetization 407 of the pinned layer 406. The spacer layer 408 is nonmagnetic. In one embodiment, the spacer layer 408 is conductive. In another embodiment, the spacer layer 408 may be a barrier layer, for example an insulating tunneling barrier layer.

The free layer 410 includes magnetic layers 412 and 416 that are separated by intermediate layer 414. The magnetizations 413 and 417 of portions of the magnetic layers 412 and 416 are also shown. The intermediate layer 414 shown is a nonmagnetic granular intermediate layer. Thus, the intermediate layer 414 includes grains, or channels, 415, that are nonmagnetic and conductive. The magnetic layers 412 and 416 are magnetically coupled. The magnetic layers 412 and 416 may also be ferromagnetically or antiferromagnetically coupled. The individual magnetic layers 412 and 416 may each be ferromagnetic or ferrimagnetic.

The free layer 410 also includes a domain wall, preferably within the magnetic layers 412 and 416 during switching. Thus, in the embodiment shown, the domain walls 418 in the magnetic layer 412 is shown. The domain wall 418 may be a cross-tie wall, and preferably operates to assist spin transfer-based switching of the free layer 410, as discussed above. The domain wall 418 preferably forms in magnetic layers 412 and 416 because the spin polarized current traveling through the free layer 410 is generally confined to the channel 415. In operation, the free layer 410 switches using a combination of domain wall motion within the layers 412 and 416 and within the channels 415. In the embodiment shown, the domain walls 418 have formed in the region of the channel 415 and move across the magnetic layer 412 to switch the magnetic layer 412. Because of the magnetic coupling between the magnetic layers 412 and 416, the magnetic layer 416 is also shown as commencing switching. Thus, the free layer 410 may switch.

The magnetic element 400 operates in a similar manner to the magnetic element 100. Consequently, the domain wall formation assists in switching the free layer 410 and may result in a lower switching current density. Furthermore, in one embodiment, one of the magnetic layers 412 and 416 is preferably soft, has a low magnetization ($M_s$) and a very low crystalline anisotropy. The other of the magnetic layers 416 and 412 may be a harder layer having a higher magnetization and a higher crystalline anisotropy. For example, the materials and relative thicknesses discussed above may be used. As a result, as discussed above, the magnetic element 400 may have lower switching current density with improved thermal stability. Consequently, the magnetic element 300 has similar benefit to the magnetic element 100.

Figure 6:
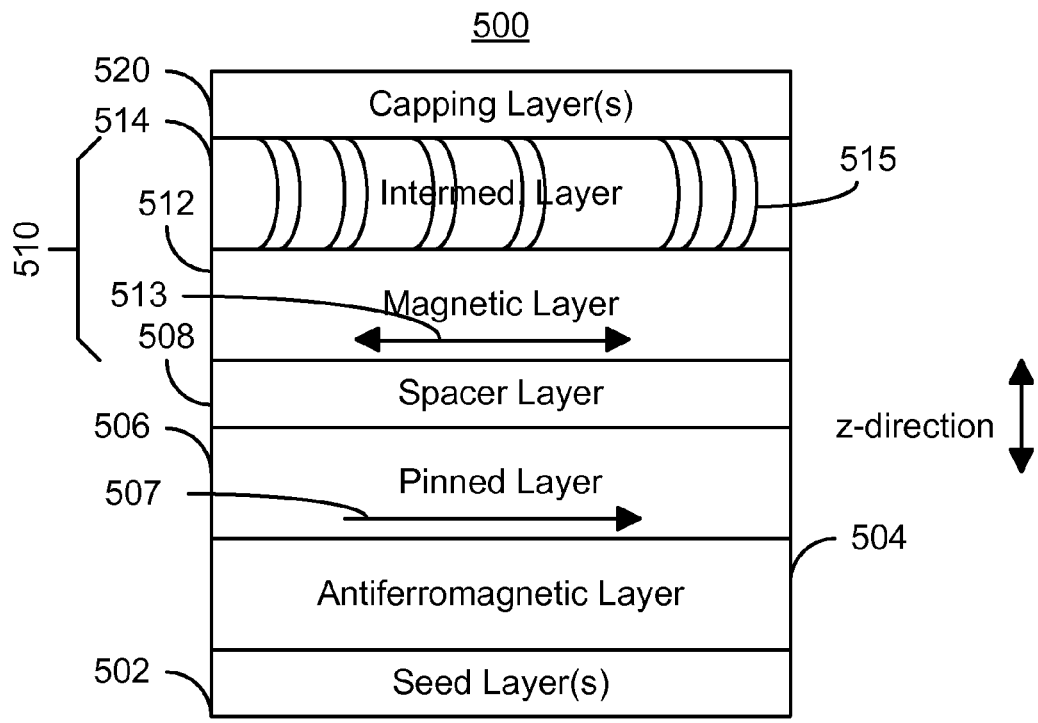
FIG. 6 is a diagram depicting another exemplary embodiment of a magnetic element including a close-up view of the domain wall in the free layer.

FIG. 6 is a diagram depicting another exemplary embodiment of a magnetic element 500 including a close-up view of the domain wall in the free layer. The magnetic element 500 is analogous to the magnetic element 100. Consequently, analogous structures are labeled similarly. The magnetic element 500 thus includes at least a pinned layer 506, a spacer layer 508, and a free layer 510. Also depicted are seed layer(s) 502, AFM layer 504, and capping layer(s) 520. The pinned layer 506 has a magnetization 507 that is preferably pinned, or substantially fixed, in place by the AFM layer 504. However, in another embodiment, the AFM layer 504 may be omitted and another mechanism used to pin the magnetization 507 of the pinned layer 506. The spacer layer 508 is nonmagnetic. In one embodiment, the spacer layer 508 is conductive. In another embodiment, the spacer layer 508 may be a barrier layer, for example an insulating tunneling barrier layer.

The free layer 510 includes magnetic layer 512 and intermediate layer 514. The intermediate layer 514 shown is a granular intermediate layer that may be magnetic or nonmagnetic. Note that although termed an intermediate layer, in the embodiment shown, only a single magnetic layer 512 is used. Thus, the intermediate layer 514 includes grains, or channels 515, that are magnetic or nonmagnetic and conductive. The magnetic layer 512 may be ferromagnetic or ferrimagnetic.

The free layer 510 also includes a domain wall (not explicitly shown in FIG. 6), preferably within the intermediate layer 514 during switching. The domain wall may be a Neel wall, Bloch wall or cross-tie wall, and preferably operates to assist spin transfer-based switching of the free layer 510, as discussed above. In one embodiment, the domain wall forms in the ferromagnetic grains, or channels, 515 of the intermediate layer 514. If the grains 515 are ferromagnetic (or ferrimagnetic), the domain wall may be formed in the channels of the granular layer or near the interface between the intermediate layer 514 and the magnetic layer 512. If the grains 515 are conductive and nonmagnetic, the domain walls may be generated in the magnetic layer 512 due to the current confinement. Thus, the portions of the magnetic layer 512 that direct contact to the grains 515 of the intermediate layer 514 may be switched first. The domain wall preferably forms in each of the channels 515 of the intermediate layer 514. In operation, the magnetic layer 512 switches using a combination of domain wall motion within the layer 512 and within the channels 515. The domain walls may thus be formed throughout the intermediate layer 514 and aid in switching the remaining magnetic layer 512.

The magnetic element 500 operates in a similar manner to the magnetic element 100. Consequently, the domain wall formation assists in switching the free layer 510 and may result in a lower switching current density. Consequently the magnetic element 500 has similar benefits to the magnetic element 100.

Figure 7:
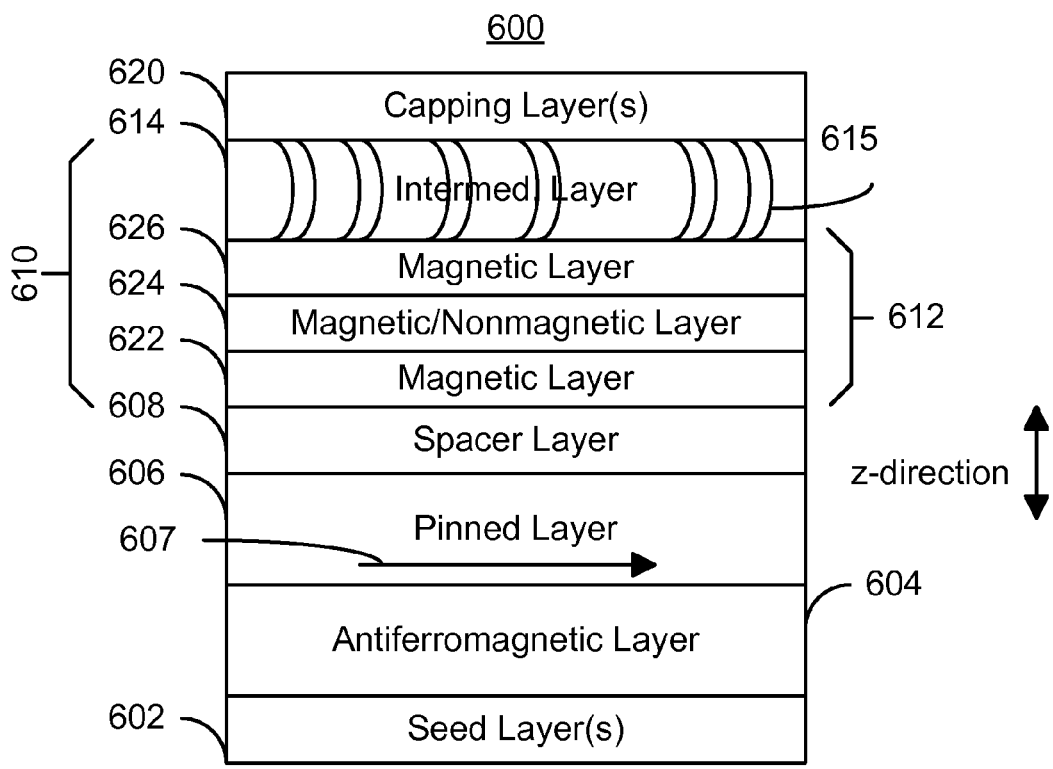
FIG. 7 is a diagram depicting another exemplary embodiment of a magnetic element including a close-up view of the domain wall in the free layer.

FIG. 7 is a diagram depicting another exemplary embodiment of a magnetic element 600 including a close-up view of the domain wall in the free layer. The magnetic element 600 is analogous to the magnetic element 100. Consequently, analogous structures are labeled similarly. The magnetic element 600 thus includes at least a pinned layer 606, a spacer layer 608, and a free layer 610. Also depicted are seed layer(s) 602, AFM layer 604, and capping layer(s) 620. The pinned layer 606 has a magnetization 607 that is preferably pinned, or substantially fixed, in place by the AFM layer 604. However, in another embodiment, the AFM layer 604 may be omitted and another mechanism used to pin the magnetization 607 of the pinned layer 606. The spacer layer 608 is nonmagnetic. In one embodiment, the spacer layer 608 is conductive. In another embodiment, the spacer layer 608 may be a barrier layer, for example an insulating tunneling barrier layer.

The free layer 610 includes magnetic layer 612 and intermediate layer 614. The intermediate layer 614 shown is a granular intermediate layer that may be magnetic or nonmagnetic. Note that although termed an intermediate layer, in the embodiment shown, only a single magnetic layer 612 is used. Thus, the intermediate layer 614 includes grains, or channels 615, that are magnetic or nonmagnetic and conductive. The free layer 610 also includes a domain wall (not explicitly shown in FIG. 7) therein during switching.

The magnetic layer 612 may be a multilayer including one or more of the layers 622, 624, and 626. The layers 622, 624, and 626 may include balanced or unbalanced magnetic layers analogous to the layers 112 and 116 of FIG. 2. Referring back to FIG. 7, the layers 622, 624, and 626 may include ferrimagnetic layers, ferromagnetic layers, two magnetic layers separated by a nonmagnetic spacer layer to form a synthetic antiferromagnet, or another combination of multilayers.

The free layer 610 also includes a domain wall, preferably within the intermediate layer 614 or magnetic layer 612 during switching. The domain wall may be a Neel wall or Bloch wall, and preferably operates to assist spin transfer-based switching of the free layer 610, as discussed above. In one embodiment, the domain wall forms in the ferromagnetic grains, or channels, 615 of the intermediate layer 614. If the grains 615 are ferromagnetic (or ferrimagnetic), the domain wall may be formed in the channels of the granular layer or near the interface between the intermediate layer 614 and the magnetic layer 612. If the grains 615 are conductive and nonmagnetic, the domain walls may be generated in the magnetic layer 612 near the grains 615 due to the current confinement. Thus, the portions of the magnetic layer 612 that direct contact to the grains 615 of the intermediate layer 614 may be switched first. The domain wall preferably forms in each of the channels 615 of the intermediate layer 614. In operation, the magnetic layer 612 switches using a combination of domain wall motion within the layer 612 and within the channels 615. The domain walls may thus be formed throughout the intermediate layer 614 or magnetic layer 612 and aid in switching the remaining magnetic layer 612.

The magnetic element 600 operates in a similar manner to the magnetic element 100. Consequently, the domain wall formation assists in switching the tree layer 610 and may result in a lower switching current density. Consequently, the magnetic element 600 has similar benefits to the magnetic element 100.

Figure 8:
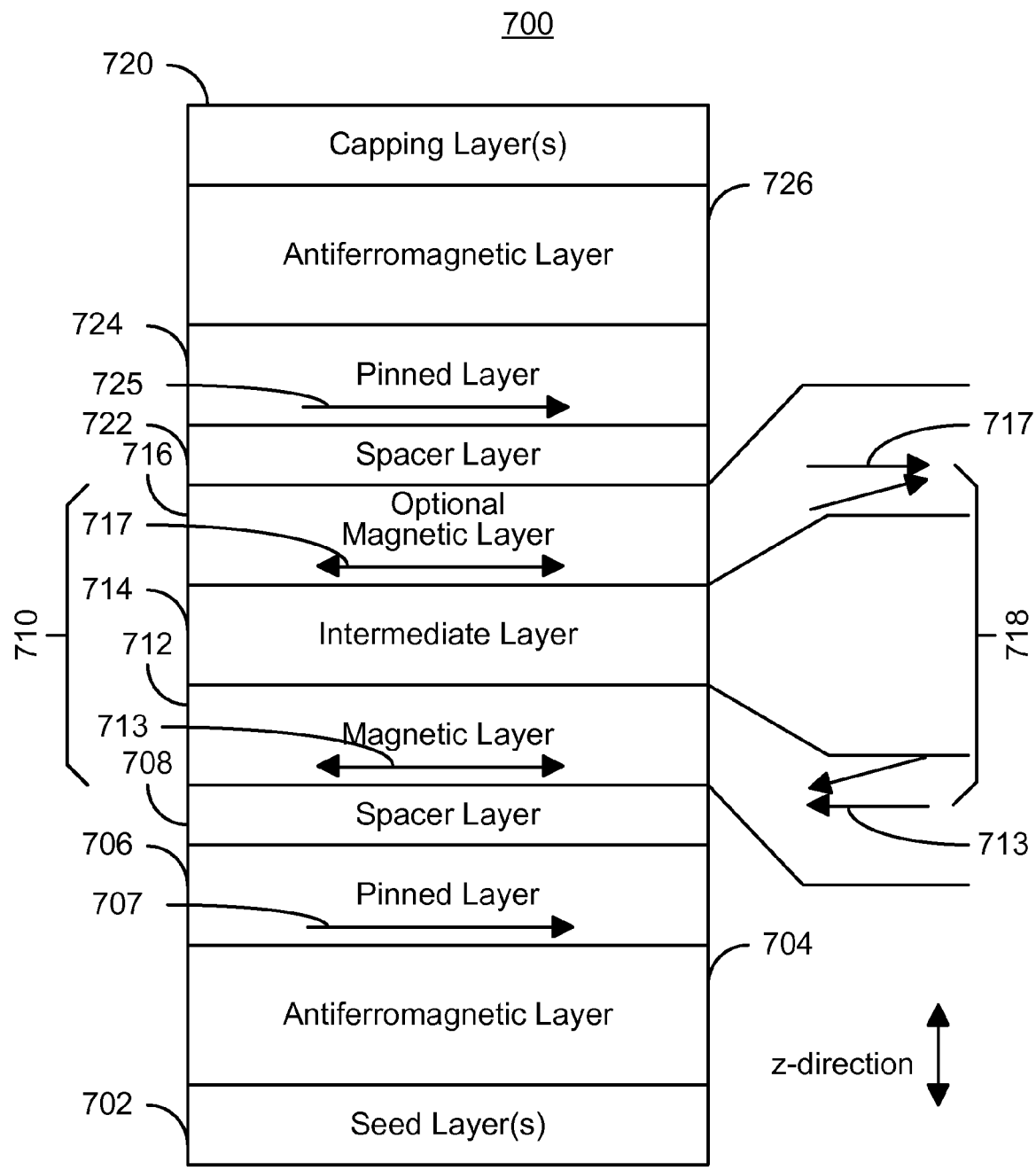
FIG. 8 is a diagram depicting another exemplary embodiment of a magnetic element including a close-up view of the domain wall in the free layer.

FIG. 8 is a diagram depicting another exemplary embodiment of a magnetic element 700 including a close-up view of the domain wall in the free layer during switching. The magnetic element 700 is analogous to the magnetic element 100. Consequently, analogous structures are labeled similarly. The magnetic element 700 thus includes at least a pinned layer 706, a spacer layer 708, and a free layer 710. Also depicted are seed layer(s) 702, AFM layer 704, and capping layer(s) 720. In addition, the magnetic element 700 includes a second spacer layer 722, a second pinned layer 724, and a second AFM layer 726. The pinned layers 706 and 724 each has a magnetization 707 and 725, respectively, that is preferably pinned, or substantially fixed, in place by the AFM layer 704 and 726, respectively. However, in another embodiment, the AFM layer 704 and/or 726 may be omitted and another mechanism used to pin the magnetization 707 and/or 725, respectively, of the pinned layer 706 and/or 724, respectively. The magnetizations 707 and 725 may be aligned or orthogonal. In an alternate embodiment, the magnetizations 707 and 725 may have another angle between them. The spacer layers 708 and 722 are nonmagnetic. In one embodiment, at least one of the spacer layer layers 708 and 722 are conductive. In another embodiment, at least one of the spacer layers 708 and 722 are may be a barrier layer, for example an insulating tunneling barrier layer.

The free layer 710 includes magnetic layers 712 and 716 that are separated by intermediate, or additional spacer, layer 714. The intermediate layer 714 is preferably conductive. The magnetic layers 712 and 716 are ferromagnetically or antiferromagnetically coupled. Consequently, the magnetizations 713 and 717, respectively, shown are during switching (i.e. when only one of the magnetic layers 712 and 716 has switched its magnetization state). The individual magnetic layers 712 and 716 may each be ferromagnetic or ferrimagnetic.

The free layer 710 includes the domain wall 718, preferably within the free layer 710 during switching. The domain wall 718 may be a geometrically-constrained magnetic wall, and preferably operates to assist spin transfer-based switching of the free layer 710, as discussed above. In operation, one of the magnetic layers 712 or 716 switches. The domain wall 718 may thus be formed in the free layer 710 and aid in switching the remaining magnetic layer 716 or 712.

The magnetic element 700 operates in a similar manner to the magnetic element 100. Consequently, the domain wall 718 formation assists in switching the tree layer 710 and may result in a lower switching current density. Moreover, in one embodiment one of the magnetic layers 712 and 716 is preferably soft, has a low magnetization ($M_s$) and a very low crystalline anisotropy. The other of the magnetic layers 716 and 712 may be a harder layer having a higher magnetization and a higher crystalline anisotropy. For example, the materials and relative thicknesses discussed above may be used. As a result, as discussed above, the magnetic element 700 may have lower switching current density with improved thermal stability. In particular, electrons traveling through, or reflected from, the layers 706 and 724 tends to switch the magnetizations of the layers 712 and 716 respectively. As a result, as discussed above, the magnetic element 700 may have an even lower switching current density, Consequently, the magnetic element 700 has similar benefits to the magnetic element 100.

Figure 9:
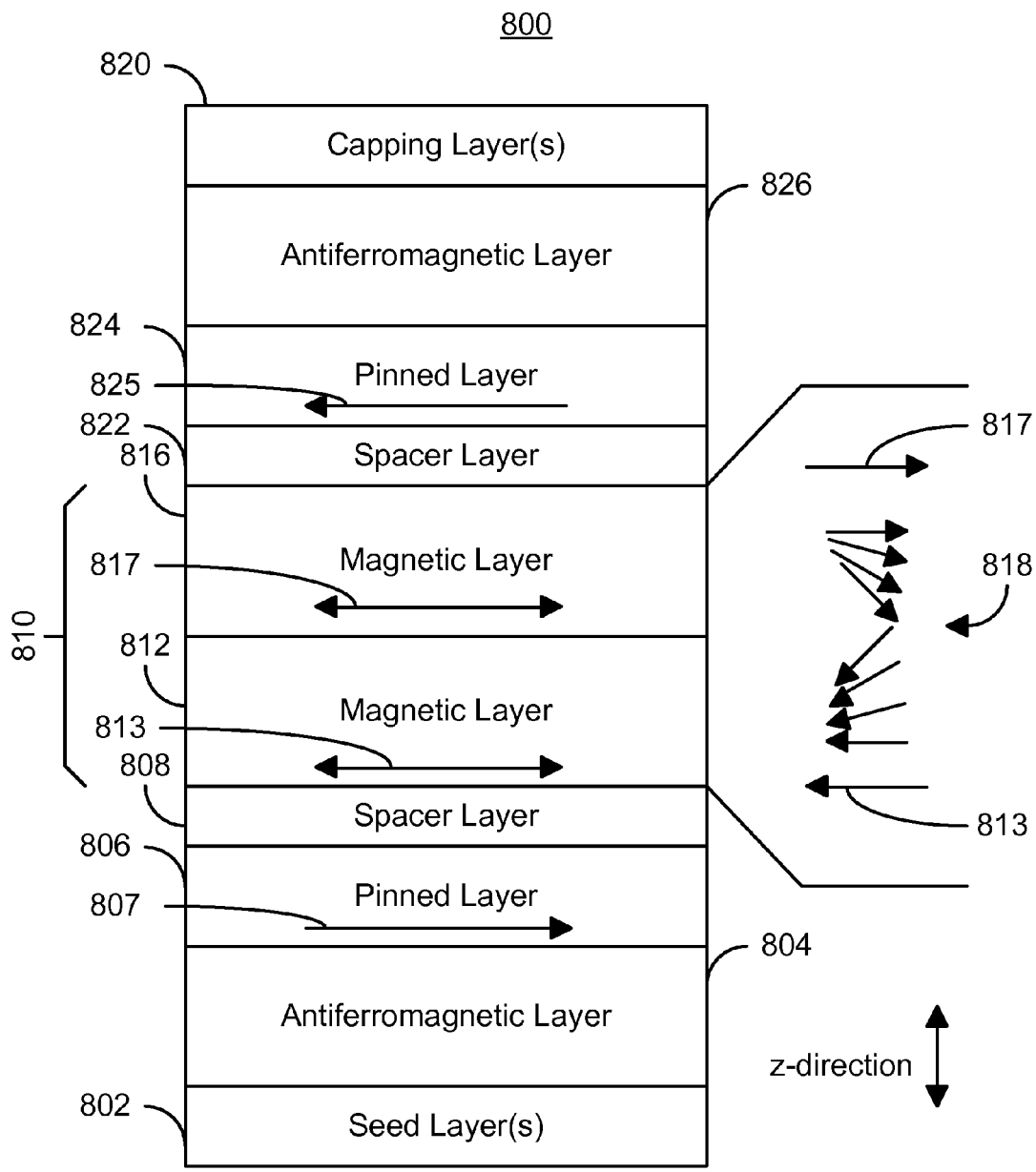
FIG. 9 is a diagram depicting another exemplary embodiment of a magnetic element including a close-up view of the domain wall in the free layer.

FIG. 9 is a diagram depicting another exemplary embodiment of a magnetic element 800 including a close-up view of the domain wall in the free layer. The magnetic element 800 is analogous to the magnetic element 100. Consequently, analogous structures are labeled similarly. The magnetic element 800 thus includes at least a pinned layer 806, a spacer layer 808, and a free layer 810. Also depicted are seed layer(s) 802, AFM layer 804, and capping layer(s) 820. In addition, the magnetic element 800 includes a second spacer layer 822, a second pinned layer 824, and a second AFM layer 826. The pinned layers 806 and 824 each has a magnetization 807 and 825, respectively, that is preferably pinned, or substantially fixed, in place by the AFM layer 804 and 826, respectively. However, in another embodiment, the AFM layer 804 and/or 826 may be omitted and another mechanism used to pin the magnetization 807 and/or 825, respectively, of the pinned layer 806 and/or 824, respectively. The magnetizations 807 and 825 are preferably aligned. In another embodiment, the magnetizations 807 and 825 are orthogonal. In an alternate embodiment, the magnetizations 807 and 825 may have another angle between them. The spacer layers 808 and 822 are nonmagnetic. In one embodiment, at least one of the spacer layer layers 808 and 822 are conductive. In another embodiment, at least one of the spacer layers 808 and 822 are may be a barrier layer, for example an insulating tunneling barrier layer.

The free layer 810 includes magnetic layers 812 and 816 that share an interface and are, therefore, adjacent. The magnetic layers 812 and 816 are ferromagnetically coupled. Consequently, the magnetizations 813 and 817, respectively, shown are during switching (i.e. when only one of the magnetic layers 812 and 816 has switched its magnetization state). The free layer 810 thus includes a domain wall 818 therein during switching. The individual magnetic layers 812 and 816 may each be ferromagnetic or ferrimagnetic.

The free layer 810 includes the domain wall 818, preferably near the interface between the layers 812 and 816. The domain wall 818 may be a Neel wall or Bloch wall, and preferably operates to assist spin transfer-based switching of the free layer 810, as discussed above. In operation, at least one of the magnetic layers 812 or 816 switches. The domain wall 818 may thus be formed near interface between the layers 812 and 816 and aid in switching the remaining magnetic layer 816 or 812.

The magnetic element 800 operates n a similar manner to the magnetic element 100, Consequently, the domain wall 818 formation assists in switching the free layer 810 and may result in a lower switching current density. Moreover, in one embodiment, one of the magnetic layers 812 and 816 is preferably soft, has a low magnetization ($M_s$) and a very low crystalline anisotropy. For example, the materials and relative thicknesses discussed above may be used. As a result, as discussed above, the magnetic element 800 may have lower switching current density with improved thermal stability. In particular electrons traveling through, or reflected from, the layers 806 and 824 tends to switch the magnetizations of the layers 812 and 816 respectively. As a result, as discussed above, the magnetic element 800 may have an even lower switching current density. Consequently, the magnetic element 800 has similar benefits to the magnetic element 100.

Figure 10:
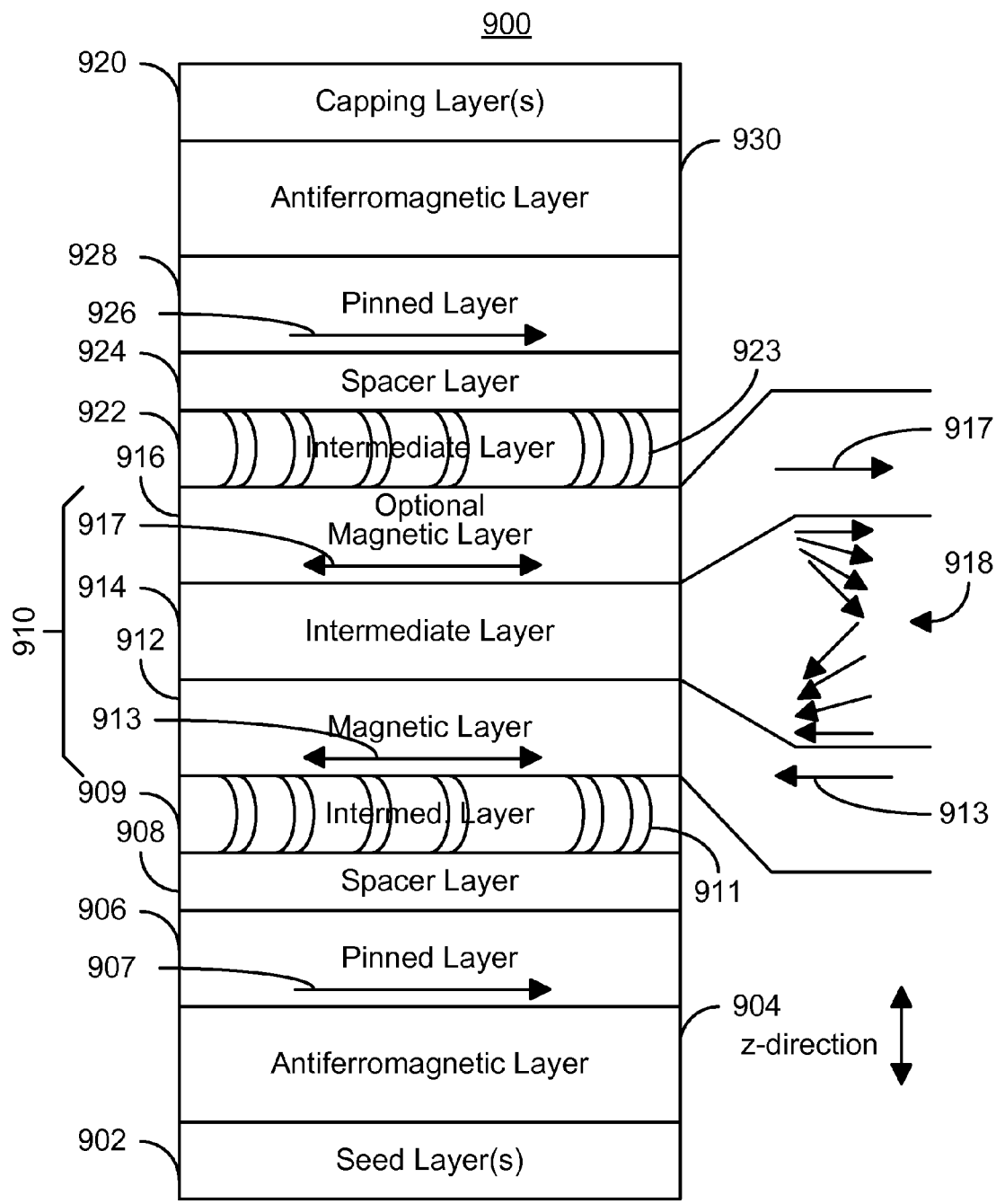
FIG. 10 is a diagram depicting another exemplary embodiment of a magnetic element including a close-up view of the domain wall in the free layer.

FIG. 10 is a diagram depicting another exemplary embodiment of a magnetic element 900 including a close-up view of the domain wall in the free layer. The magnetic element 900 is analogous to the magnetic element 100. Consequently, analogous structures are labeled similarly. The magnetic element 900 thus includes at least a pinned layer 906, a spacer layer 908, and a free layer 910. Also depicted are seed layer(s) 902, AFM layer 904, and capping layer(s) 920. In addition, the magnetic element 900 includes an intermediate layer 909 having grains 911, an additional intermediate layer 922 having grains 923, a second spacer layer 924, a second pinned layer 928, and a second AFM layer 930. The intermediate layer 922 shown is a nonmagnetic granular or porous intermediate layer. Thus, the intermediate layer 922 includes grains, or channels 923, which are nonmagnetic and conductive. Similarly, the intermediate layer 909 includes grains (or channels) 911 that are nonmagnetic and conductive. The pinned layers 906 and 928 each has a magnetization 907 and 926, respectively, that is preferably pinned, or substantially fixed, in place by the AFM layer 904 and 930, respectively. However, in another embodiment, the AFM layer 904 and/or 930 may be omitted and another mechanism used to pin the magnetization 907 and/or 926, respectively, of the pinned layer 906 and/or 928, respectively. The magnetizations 907 and 926 are preferably aligned or orthogonal. In an alternate embodiment, the magnetizations 907 and 926 may have another angle between them. The spacer layers 908 and 924 are nonmagnetic. In one embodiment, at least one of the spacer layer layers 908 and 924 are conductive. In another embodiment, at least one of the spacer layers 908 and 924 are may be a barrier layer, for example an insulating tunneling barrier layer.

The free layer 910 includes magnetic layers 912 and 916 that are preferably separated by an intermediate layer 914. The intermediate layer 914 is preferably conductive. The magnetic layers 912 and 916 are magnetically coupled. The free layer 910 thus includes a domain wall 918 therein during switching. The individual magnetic layers 912 and 916 may each be ferromagnetic or ferrimagnetic.

The free layer 910 includes the domain wall 918, preferably in the free layer 910 or in the magnetic layer 916. The domain wall 918 may be a geometrically constrained magnetic wall or cross-tie domain wall, and preferably operates to assist spin transfer-based switching of the free layer 910, as discussed above. In operation, one of the magnetic layers 912 or 916 switches. The domain wall 918 may thus aid in switching the remaining magnetic layer 916 or 912.

The magnetic element 900 operates in a similar manner to the magnetic element 100. Consequently, the domain wall 918 formation assist in switching the tree layer 910 and may result in a lower switching current density. Moreover, in one embodiment one of the magnetic layers 912 and 916 is preferably soft, has a low magnetization ($M_s$) and a very low crystalline anisotropy. For example, the materials and relative thicknesses discussed above may be used. As a result, as discussed above, the magnetic element 900 may have lower switching current density with improved thermal stability. In particular electrons traveling through, or reflected from, the layers 906 and 928 tends to switch the magnetizations of the layers 912 and 916 respectively. As a result, as discussed above, the magnetic element 900 may have an even lower switching current density Consequently, the magnetic element 900 has similar benefits to the magnetic element 100.

Figure 11:
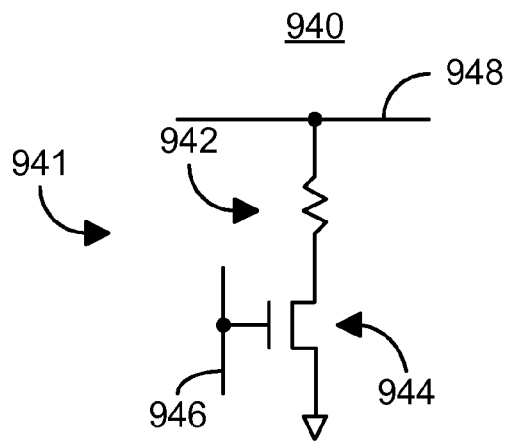
FIG. 11 is a diagram depicting an exemplary embodiment of a magnetic memory.

FIG. 11 is a diagram depicting an exemplary embodiment of a portion of a magnetic memory 940. The magnetic memory 940 essentially depicts a magnetic storage cell 941 that includes magnetic element(s) 942 and an isolation transistor(s) 944. The magnetic element 942 may be one or more of the magnetic elements 100, 200, 300, 400, 500, 600, 700, 800, and 900. Because the magnetic element 100, 200, 300, 400, 500, 600, 700, 800, and/or 900 is used for the magnetic element 942, the magnetic memory 940 shares the benefits of the magnetic elements 100, 200, 300, 400, 500, 600, 700, 800, and/or 900. In particular, a reduced bias (or write) current may be used for switching. Thus, a smaller isolation transistor 944 may be used. In addition, power consumption during write operations may be reduced.

Furthermore, in the thermal stability may be enhanced. In conventional magnetic elements 10, a high volume and aspect ratio (length/width) are typically required to maintain the magnetic energy barrier (with the shape anisotropy being dominant). This magnetic energy barrier provides a barrier against thermal switching of the magnetic element and, therefore, thermal stability. The large length (high aspect ratio) is a limitation on the minimum size of the conventional magnetic element 10 and thus the density of a conventional magnetic memory. In contrast, in some embodiments, the magnetic elements 100, 200, 300, 400, 500, 600, 700, 800, and/or 900 utilizes a combination of hard and soft layers, as described above. As a result, the magnetic energy barrier is enhanced. In addition, $H_c$, the spin flop field, is square root proportional to the exchange coupling stiffness $J_{ex}$, and the saturation field $H_{sat}$ also varies linearly with $J_{ex}$. The increase in the exchange coupling stiffness for some of the embodiments of the magnetic element 100, 200, 300, 400, 500, 600, 700, 800, and/or 900 further improves the resistance of the magnetic elements 100, 200, 300, 400, 500, 600, 700, 800, and/or 900 to the thermal disturbance and stray field disturb. Consequently, thermal stability of the magnetic memory 940 may be improved.

In addition, in some embodiments, the magnetic element 100, 200, 300, 400, 500, 600, 700, 800, and/or 900 may utilize synthetic pinned layers, which generally include at least two antiferromagnetically aligned ferromagnetic layers separated by a nonmagnetic spacer layer. The small net magnetization in the synthetic pinned layers results in a small or zero magnetic static field from pinned layer, respectively, to the free layer. This, in turn, leads to a reduction of MR curve offset due to magnetic static coupling between free layer and pinned layer. Thus, a higher reliability in spin-transfer writing operation with a tighter $I_c$ distribution may be achieved. In addition, such a magnetic element may have better thermal stability and immunization to the external fields. Thus, the magnetic memory 940 may be enhanced.

In addition, in some embodiments, the magnetic element 700, 800, and/or 900 may utilize orthogonal pinned layers. For example, pined layers 707 and 725 in element 700 may be set orthogonal to each other. The orthogonal magnetizations in the pinned layers 707 and 725 may result in a higher TMR than the parallel magnetizations in the pinned layers 707 and 725. Furthermore, in element 800, pinned layers 807 and 825 may be set to orthogonal to enhance TMR ratio. Similarly in element 900, the magnetization 907 of the pinned layer 906 may be set to orthogonal to the magnetization 926 of the top pinned layer 928 to enhance TMR ratio.

Figure 12:
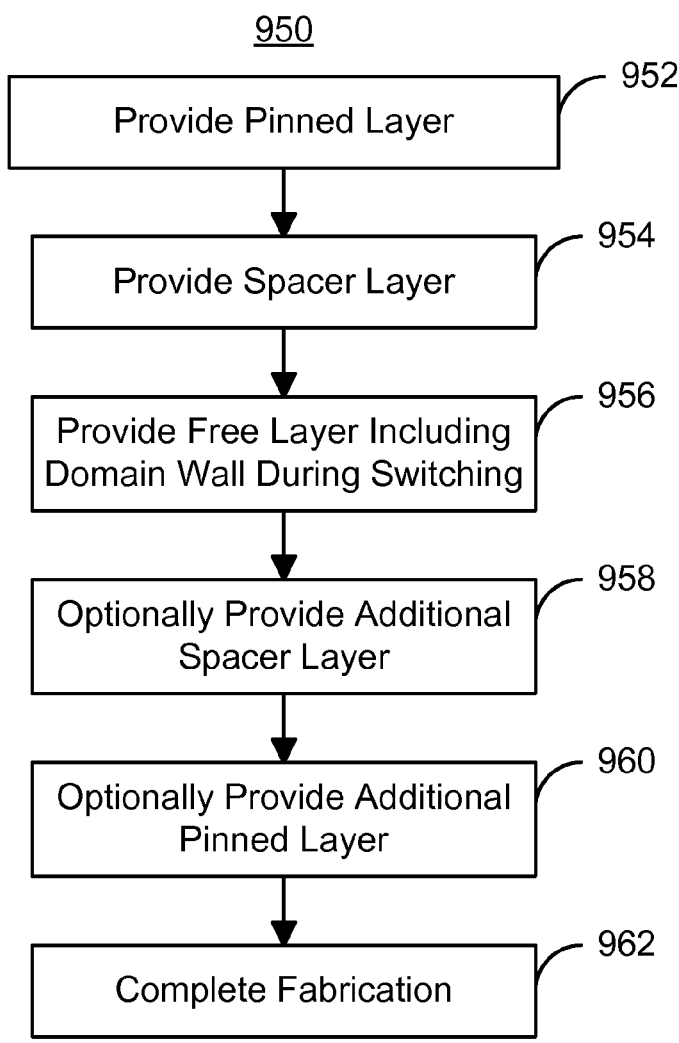
FIG. 12 is a flow chart depicting an exemplary embodiment of a method for providing a magnetic element.

FIG. 12 is a flow chart depicting an exemplary embodiment of a method 950 for providing a magnetic element. The pinned layer 106, 206, 306, 406, 506, 606, 706, 806, and/or 906 for the magnetic element 100, 200, 300, 400, 500, 600, 700, 800, and/or 900, respectively, via step 952. The spacer layer 108, 208, 308, 408, 508, 608, 708, 808, and/or 908 for the magnetic element 100, 200, 300, 400, 500, 600, 700, 800, and/or 900, respectively, via step 954. The free layer 110, 210, 310, 410, 510, 610, 710, 810, and/or 910 for the magnetic element 100, 200, 300, 400, 500, 600, 700, 800, and/or 900, respectively, via step 956. Thus, any magnetic and intermediate layers for the free layer may be provided in step 956. An additional spacer and pinned layer may optionally be provided, via steps 958 and 960, respectively. If the pinned layers are to be aligned in different directions, then 960 may include utilizing a different AFM material for pinning the second pinned layer than for the first pinned layer provided in step 952 and annealing at a different temperature and field. Thus, for example, the magnetic elements 700, 800, and/or 900 may be fabricated. Consequently, the benefits of the magnetic elements 100, 200, 300, 400, 500, 600, 700, 800, and/or 900 may be achieved.

A method and system for providing a magnetic memory element has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic element comprising:
   a pinned layer;
   a spacer layer, the spacer layer being nonferromagnetic; and
   a free layer, the spacer layer residing between the pinned layer and the free layer, the free layer including at least a first magnetic layer and at least one of a second magnetic layer and an intermediate layer, the free layer also including at least one domain wall therein during switching;
   wherein the magnetic element is configured to allow the free layer to be switched at least in part due to spin transfer when a write current is passed through the magnetic element.

2. The magnetic element of claim 1 wherein the pinned layer is a synthetic pinned layer including a first ferromagnetic layer, a second ferromagnetic layer, and a nonmagnetic spacer layer between the first ferromagnetic layer and the second ferromagnetic layer.

3. The magnetic element of claim 1 wherein the first magnetic layer is magnetically coupled with the second magnetic layer and wherein the first magnetic layer and second magnetic layer are adjacent.

4. The magnetic element of claim 3 wherein the first magnetic layer is a soft magnetic layer having at least one of a low magnetization and a low crystalline anisotropy.

5. The magnetic element of claim 3 wherein the second magnetic layer has at least one of a magnetization higher than the low magnetization and a crystalline anisotropy greater than the low crystalline anisotropy.

6. The magnetic element of claim 3 wherein the first magnetic layer is antiferromagnetically coupled with the second magnetic layer.

7. The magnetic element of claim 3 wherein the first magnetic layer is ferromagnetically coupled with the second magnetic layer.

8. The magnetic element of claim 1 wherein the free layer further includes both the intermediate layer and the second magnetic layer, the intermediate layer residing between the first magnetic layer and the second magnetic layer.

9. The magnetic element of claim 8 wherein the intermediate layer is one of a conductive layer, an insulating layer, and a granular layer including an insulating matrix and a plurality of grains, the plurality of grains being at least one of conductive, and ferromagnetic, and ferrimagnetic.

10. The magnetic element of claim 8 wherein the intermediate layer is at least one of nonmagnetic, ferromagnetic, and ferrimagnetic.

11. The magnetic element of claim 8 wherein the first magnetic layer is a soft magnetic layer having a low magnetization or a low crystalline anisotropy.

12. The magnetic element of claim 8 wherein the second magnetic layer has at least one of a magnetization higher than the low magnetization and a crystalline anisotropy greater than the low crystalline anisotropy.

13. The magnetic element of claim 8 wherein the first magnetic layer is antiferromagnetically coupled with the second magnetic layer.

14. The magnetic element of claim 8 wherein the first magnetic layer is ferromagnetically coupled with the second magnetic layer.

15. The magnetic element of claim 1 further comprising:
an additional spacer layer, the additional spacer layer being nonmagnetic; and
an additional pinned layer, the additional spacer layer residing between the free layer and the additional pinned layer.

16. The magnetic element of claim 15 wherein the pinned layer has a magnetization direction and the additional pinned layer has the magnetization direction.

17. The magnetic element of claim 15 wherein the pinned layer has a first magnetization direction and the additional pinned layer has a second magnetization at an angle from the first magnetization direction, the angle being greater than zero degrees and less than three hundred sixty degrees.

18. The magnetic element of claim 17 wherein the first magnetization direction is orthogonal to the second magnetization direction.

19. The magnetic element of claim 15 wherein at least one of the pinned layer and the additional pinned layer is a synthetic pinned layer including at least a first ferromagnetic layer, a second ferromagnetic layer, and a nonmagnetic spacer layer between the first ferromagnetic layer and the second ferromagnetic layer.

20. The magnetic element of claim 4 wherein the first magnetic layer includes at least one of CoFeNiB and CoFeB.

21. A magnetic element comprising
a pinned layer;
a spacer layer, the spacer layer being nonferromagnetic; and
a free layer, the spacer layer residing between the pinned layer and the free layer, the free layer including at least one domain wall therein during switching, the free layer including a first magnetic layer and a second magnetic layer, the first and second magnetic layers being at least one of antiferromagnetically coupled and ferromagnetically coupled;
wherein the magnetic element is configured to allow the free layer to be switched at least in part due to spin transfer when a write current is passed through the magnetic element.

22. A magnetic memory comprising:
a plurality of magnetic cells, each of the plurality of magnetic cells including at least one magnetic element, each of the at least one magnetic element including a pinned layer, a spacer layer, and a free layer, the spacer layer being nonferromagnetic, the free layer including a first magnetic layer and at least one of a second magnetic layer and an intermediate layer, the free layer further including at least one domain wall during switching; and
wherein the magnetic element is configured to allow the free layer to be switched at least in part due to spin transfer when a write current is passed through the magnetic element.

23. The magnetic memory of claim 22 wherein the first magnetic layer is magnetically coupled with the second magnetic layer.

24. The magnetic memory of claim 23 wherein the first magnetic layer is a soft magnetic layer having a low magnetization and a low crystalline anisotropy.

25. The magnetic memory of claim 24 wherein the second magnetic layer has at least one of a magnetization higher than the low magnetization and a crystalline anisotropy greater than the low crystalline anisotropy.

26. The magnetic memory of claim 22 wherein the free layer further includes the intermediate layer residing between the first magnetic layer and the second magnetic layer.

27. The magnetic memory of claim 26 wherein the intermediate layer is at least one of a conductive layer, an insulating layer, and a granular layer including an insulating matrix and a plurality of grains, the plurality of grains being at least one of conductive, ferromagnetic, and ferrimagnetic.

28. The magnetic memory of claim 26 wherein the intermediate layer is at least one of nonmagnetic, ferromagnetic, and ferrimagnetic.

29. The magnetic memory of claim 26 wherein the first magnetic layer is a soft magnetic layer having a low magnetization or a low crystalline anisotropy.

30. The magnetic memory of claim 26 wherein the second magnetic layer is a magnetization higher than the low magnetization or a crystalline anisotropy greater than the low crystalline anisotropy.

31. The magnetic memory of claim 22 wherein the first magnetic layers has a magnetization, a crystalline anisotropy, and a thickness, the second magnetic layer has the magnetization, the crystalline anisotropy and a second thickness different from the first thickness.

* * * * *